US005590996A

United States Patent [19]
Thompson et al.

[11] Patent Number: 5,590,996
[45] Date of Patent: Jan. 7, 1997

[54] WAFER TRANSFER APPARATUS

[75] Inventors: Steven R. Thompson, Somers; Rikki S. LaBere, Kalispell, both of Mont.

[73] Assignee: Semitherm, Kalispell, Mont.

[21] Appl. No.: 322,754

[22] Filed: Oct. 13, 1994

[51] Int. Cl.⁶ .................................................. B65G 65/00
[52] U.S. Cl. ...................... 414/416; 294/87.1; 294/103.1; 414/937; 414/941
[58] Field of Search .................................. 414/416, 331, 414/941, 937, 744.8; 901/39; 294/87.1, 103.1, 104

[56] References Cited

U.S. PATENT DOCUMENTS

| 4,813,732 | 3/1989 | Klem | 414/941 X |
|---|---|---|---|
| 4,875,824 | 10/1989 | Moe et al. | 294/103.1 X |
| 4,900,214 | 2/1990 | Ben | 414/941 X |
| 5,022,695 | 6/1991 | Ayers | 414/941 X |
| 5,054,988 | 10/1991 | Shiraiwa | 414/744.8 X |
| 5,133,635 | 7/1992 | Malin et al. | 414/941 X |
| 5,404,894 | 4/1995 | Shiraiwa | 414/941 X |

FOREIGN PATENT DOCUMENTS

| 239865 | 9/1989 | Japan | 414/941 |
|---|---|---|---|
| 9419821 | 9/1994 | WIPO | 414/941 |

*Primary Examiner*—David A. Bucci
*Attorney, Agent, or Firm*—Wells, St. John, Roberts, Gregory & Matkin, P.S.

[57] ABSTRACT

A wafer transfer apparatus capable of simultaneously transferring multiple semiconductor wafers to and from a furnace or similar columnar wafer station. The apparatus has a cantilevered extension which extends from a main part. The extension is preferably mounted for pivotal movement. The extension has a distal engagement head mounted thereon. The distal engagement head is moved between a lateral position and an upstanding engaging position. The engagement head has a plurality of wafer support features which support the far edges of a group of wafers. The near edges of the wafers are held by proximal wafer contact heads.

65 Claims, 6 Drawing Sheets

WAFER TRANSFER APPARATUS

TECHNICAL FIELD

The field of this invention is apparatuses and methods for transferring semiconductor wafers, substrates, flat panel displays, data disks and similar panels between processing equipment, especially to and from wafer processing furnaces.

BACKGROUND OF THE INVENTION

In the semiconductor processing industry there are many instances where wafers are treated in thermal processors using a variety of gases, pressures and processing temperatures. The thermal processors are typically referred to as wafer processing furnaces, or more simply as furnaces. Most furnaces use a quartz processing vessel which encloses 3the process chamber. The process chambers are usually large enough for a significant number of wafers to be simultaneously processed. Wafer processing furnace arrays having capacities of 50–200 wafers are used. Furnace arrays are often in a vertical column arrangement wherein wafers are maintained in spaced parallel face-to-face relationship perpendicular to a vertical longitudinal axis.

Previously it has been the practice to load and unload wafers and substrates from such furnaces using a wafer handling robot or similar mechanical arm. Such robots or handling arms include wafer, substrates and panel engagement tools which are mounted at the distal ends of the arms. The wafer engagement tools are often devices called end effectors. These end effectors or other engagement tools engage and support each wafer as it is moved to and from the furnace array. Many end effectors utilize vacuum to hold the wafers.

Wafer processing furnaces typically have support rails which extend vertically within the processing vessel to support the wafers in spaced parallel relationship. The support rails typically have wafer support grooves or other wafer support features which receive the edges of the wafers to support them in their desired position. The wafer support features only engage a wafer along a narrow band adjacent the peripheral edge of the wafer.

The loading and unloading of wafer furnaces consumes significant time as each wafer is loaded or unloaded in turn. The processes of loading, unloading or otherwise moving such wafers to or from the furnaces are herein referred to as wafer transferring. Because of the close spacing of the adjacent wafers in a furnace array there must be precise mechanical maneuvering. Wafers are inserted parallel to the faces of the adjacent wafers with great care and exactitude. Each wafer is brought into position and then lowered axially a small distance and onto the support features of the furnace support rails. Conversely, when wafers are unloaded, the wafer transfer arm must very precisely insert the engagement tool beneath the wafer being unloaded. Misplacements can be catastrophic causing multiple wafers to be damaged or destroyed. Since each wafer can be of great value, any such mistakes can be very costly.

The care and precision needed to reliably load and unload wafers limits speed and further exacerbates the significant time needed to individually load and unload each wafer in a large-wafer furnace array. The significance of the transfer times is further amplified because the processing furnaces are very costly pieces of production equipment which need to be fully utilized to provide more economic operation and reduced costs to the consumer.

Thus there is a need for improved transfer apparatus and methods which can reliably handle and transfer semiconductor wafers or other similar panels to and from processing equipment.

BRIEF DESCRIPTION OF THE DRAWINGS

Preferred embodiments of the invention are described below with reference to the accompanying drawings, which are briefly described below.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
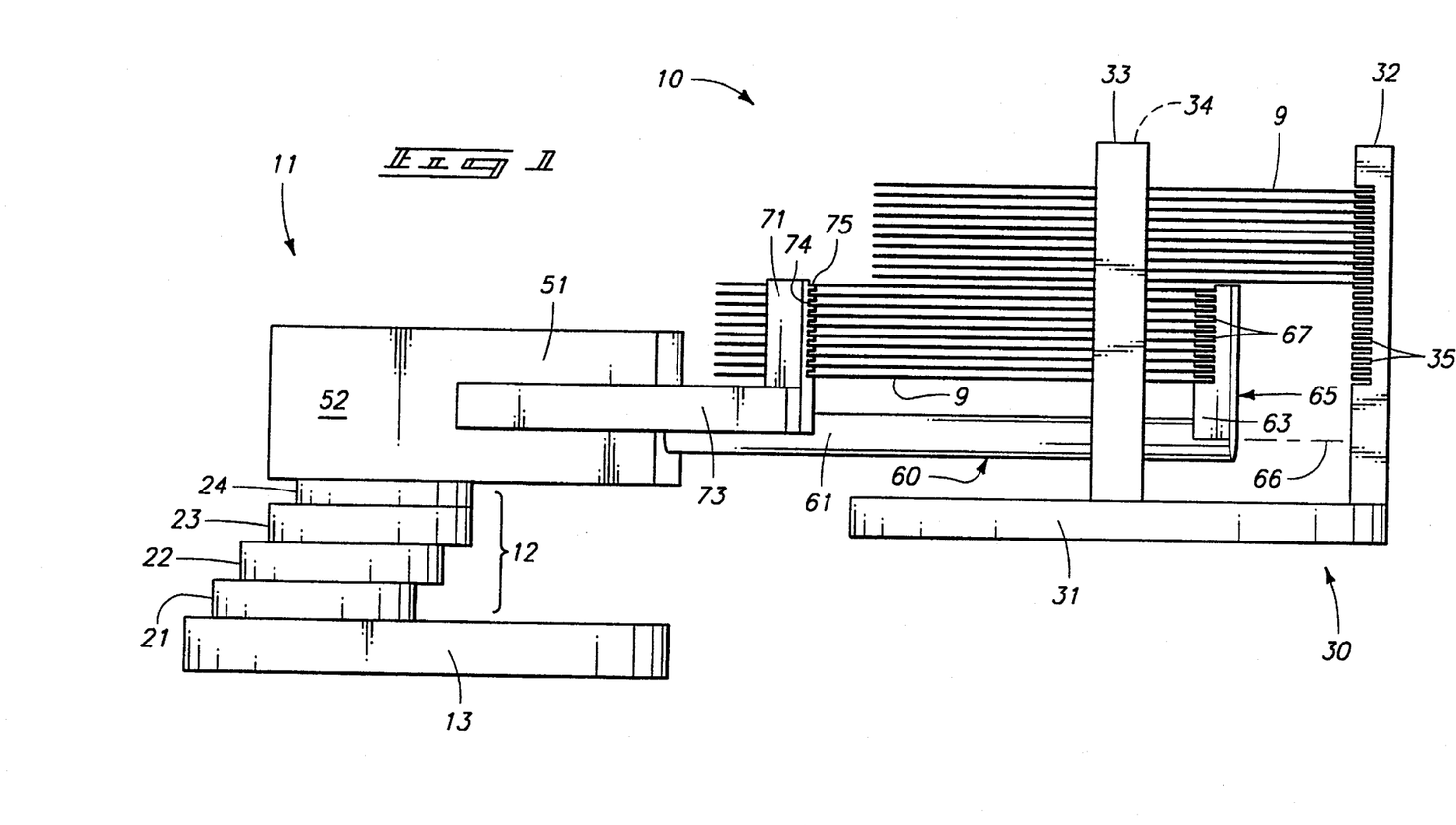
FIG. 1 is an elevational view showing a schematic wafer furnace array being loaded using a novel wafer transfer apparatus according to this invention.

FIG. 1 shows a preferred wafer transfer apparatus 10 according to this invention. Wafer transfer apparatus 10 includes a transfer head assembly 11, robotic transfer arm 12, and a base 13. As shown the transfer arm 12 includes a first transfer arm member 21 which is pivotally connected to base 13. A second transfer arm member 22 is pivotally connected to the first transfer arm member 21. A third transfer arm member 23 is pivotally connected to the second transfer arm member 22. Transfer head 11 is pivotally connected at the distal end of the third transfer arm member 23 using a pivotal connection part 24. Transfer arm 12 can be of numerous alternative constructions.

Wafer transfer apparatus 10 is used to load and unload wafers from a wafer furnace or other wafer station. As shown in FIG. 1, apparatus 10 is used to load and unload a furnace wafer station array 30 which is only schematically shown. Furnace 30 has a base plate 31. Three longitudinal wafer support rails 32, 33, and 34 extend vertically upward from the base plate 31. Rails 32–34 form a wafer station which supports a plurality of wafers in a columnar, discretely spaced wafer station array. The distal support rail 32 is roughly opposite the transfer side of the wafer station. The side support rails 33 and 34 are along the sides of the direction of transfer into and from the wafer station.

The wafer station support rails 32–34 have wafer support features which individually support the wafers 9 in the columnar array. As shown, the wafer support features are advantageously grooves 35 formed along inwardly facing surfaces of the wafer support rails. Other supports are alternatively possible.

Figure 4:
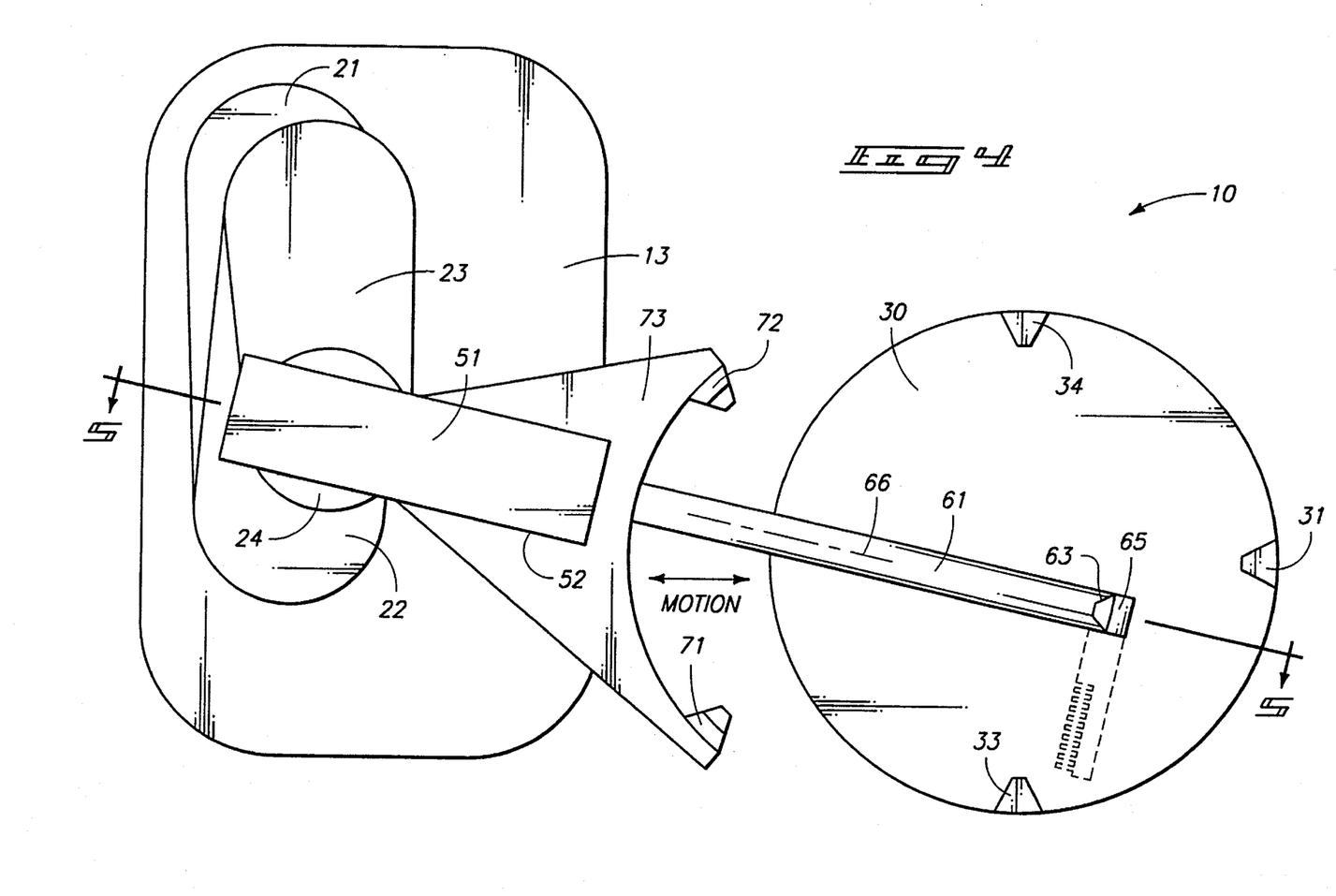
FIG. 4 is a top view of the head portion of the wafer transfer apparatus of FIG. 1.

The wafer transfer head assembly 11 includes a main or primary part or subassembly 51. Primary subassembly 51 includes a housing 52 which is connected to the third transfer arm member at a controlled pivot connection 24 of the third transfer arm member. This allows the wafer transfer head to be maintained in a desired orientation as the transfer arm assembly extends or retracts to and from station 30. FIG. 4 shows that the preferred direction of travel is not aligned with the axis 66 of the wafer transfer head assembly. The direction of travel is perpendicular to a line extending between the support rails 33 and 34.

The primary subassembly 51 also preferably includes wafer supports in the form of wafer contact heads 71 and 72. Contact heads 71 and 72 are mounted upon a mounting bar 73 which is rigidly mounted upon the end of the primary subassembly housing 52. The proximal contact heads 71 and 72 are also provided with wafer support features, such as the receiving grooves 74 and complementary support extensions 75 having wafer support surfaces 76 along the upper faces of each such support extension. The elevational positions of the wafer support features on engagement head 65 and contact heads 71 and 72 are coordinated so that wafers are preferably received in a level orientation.

The wafer transfer head assembly 11 also includes a secondary subassembly 60 which includes an extension shaft or rod member 61 which is cantilevered from the primary subassembly so as to reach to the distal side of the wafers being held by the wafer transfer head.

The distal end of the secondary subassembly extension shaft mounts a distal wafer engagement head 65. Distal wafer engagement head 65 is preferably either integrally formed or otherwise non-rotatably connected to shaft 61. Engagement head 65 is preferably formed as a slender projection which extends transversely from the longitudinal axis 66 of the extension shaft. Most preferably, the engagement head is perpendicular to the longitudinal axis 66. Engagement head 65 is provided with a suitable number of wafer support features, such as wafer support grooves 67. Grooves 67 are formed along the inwardly facing surfaces of the engagement head. The portions of the engagement head between the grooves form wafer support extensions 68 having upwardly facing wafer support surfaces 69. The side surfaces 63 of the engagement head are preferably converging inwardly to form a pointed, rounded or truncated apex. This construction minimizes potential interference between the engagement head and wafers when the head is swung between upstanding and laterally extending positions.

An actuator 53 is mounted within housing 52. A preferred form of actuator is shown in greater detail in FIGS. 5–7. Actuator 53 supports and moves the extension shaft 61 in a desired manner of motion. As shown, this motion includes both pivotal action and a small amount of axial motion, such as approximately 0.35 inch (~8 millimeters) of axial movement, providing axial extension and retraction. The output of the actuator is via an actuator extension shaft receptacle 54 which receives portions of extension shaft 61. The extension shaft supports and forms a part of secondary subassembly 60. Other constructions are alternatively possible.

Figure 5:
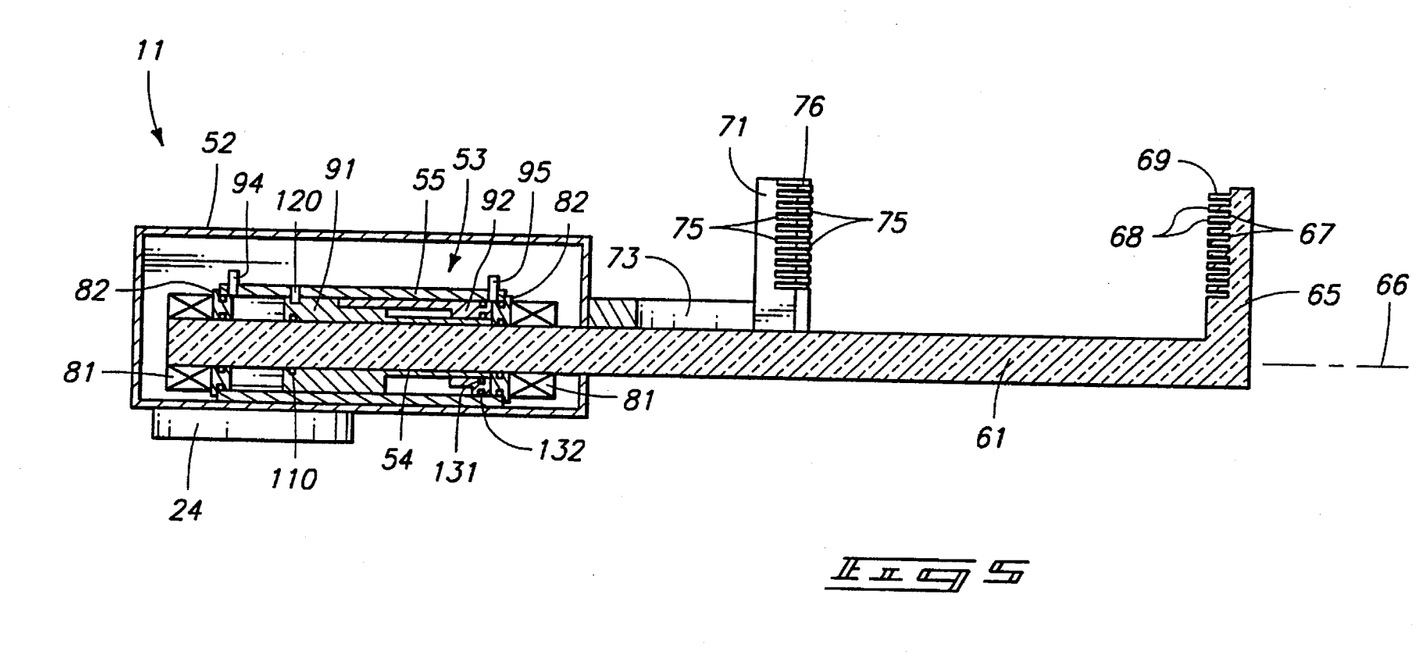
FIG. 5 is a sectional view taken along line 5—5 of FIG. 4.

Actuator 53 includes a pair of support bearings 81 which are preferably bushing type or other suitable bearings. Inward from bearings 81 are seals 82. Seals 82 include a seal housing and inner and outer O-ring or other suitable seals. Seals 82 seal between the outer diameter of the extension shaft 61 and the inner diameter of the actuator housing 55.

Mounted within actuator housing 55 is a pair of movable actuator parts 91 and 92. First part 91 is connected to the extension shaft 61 using a set screw 93 (FIG. 6) which is threaded into first part 91 and bears against the shaft, preferably along a flat (not shown) ground on the surface of the shaft. The actuator housing has a back port 94 and a front port 95. A suitable pressure supply is controllably directed to the housing ports to move the actuator assembly. In the preferred form, vacuum pressure is controllably supplied to the ports. Vacuum is applied to the front port 95 to extend the shaft 61 outwardly and pivot the shaft head 65 into a lateral position. Vacuum is applied to the rear port 94 to pivot the shaft head 65 into an upstanding position and to retract the shaft axially inwardly toward the actuator.

Figure 6:
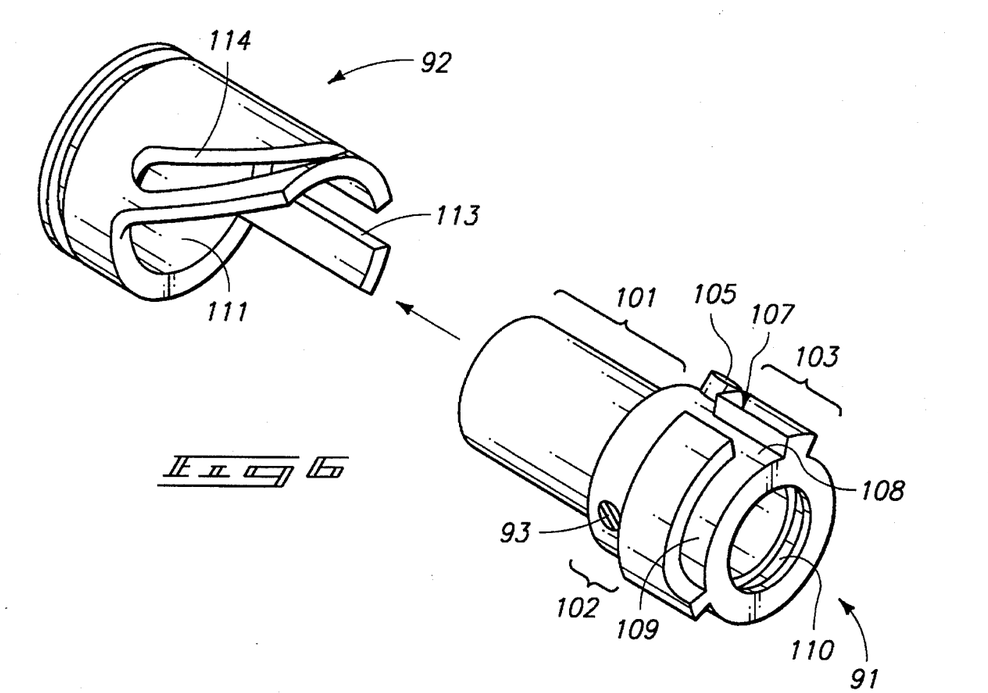
FIG. 6 is an exploded perspective view showing two parts of a preferred actuator forming a part of the wafer transfer apparatus of FIG. 1.
Figure 7:
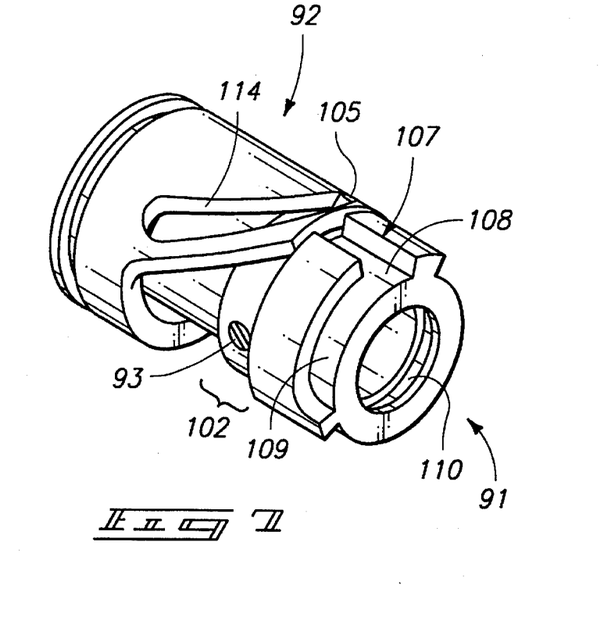
FIG. 7 is a perspective view showing the two parts shown in FIG. 6 in an assembled condition.

The first and second actuator parts 91 and 92 are specially constructed to provide the type of motion just described. First part 91 includes a shaft portion 101 which is received within a shaft receiving bore 111 which forms the inside diameter of second part 92. Second part 92 is restrained to only move back and forth axially. This restraint is accomplished by a pin (not shown) which is mounted in the actuator housing 55 and is slidably received in a second part anti-pivot groove 113. Thus the second part slides axially in response to applied vacuum pressure.

Second part 92 also has a pivot actuation groove 114 which extends in a helical path about the rearward extension portion of that part. A pin 105 extends from the second section 102 of first part 91 into groove 114. Pin 105 is slidable within groove 114. Force is applied between pin 105 and groove 114 to pivot first part 91 relative to second part 92, and vice versa. Second part 92 also has inner and outer seals 131 and 132.

First part 91 is constructed with a third section 103. Third section 103 is sufficiently large that raised portions thereof forming a third section boss fit in slidable relationship with the inside diameter of housing 55. The third section boss has a path defining groove 107 which is L-shaped. Groove 107 has an axial leg portion 108 and a pivot leg portion 109. Groove 107 receives a pin 120 which is fixed in the housing 55. An inner seal 110 seals between the first part and the extension shaft 61.

Operation will first be described with the head 65 in a laterally oriented position. In operation vacuum is applied through the rear port 94. This causes an axial force to be developed upon the end of the second part 92. This forces the sidewalls of groove 114 against pin 105. The pin (not shown) and longitudinal groove 113 keep second part 92 moving axially despite the beveled relationship between pin 105 and helical groove 114. Force is thus applied which causes the first part 91 to pivot. This pivotal action occurs with pin 120 received within the pivot leg 109 of groove 107. When pin 120 reaches the juncture of the legs of groove 107, then pivot action stops and the extension shaft head 65 is in an upstanding position. The vacuum pressure then causes first part 91 to move axially as groove 108 slides relative to pin 120. Axial motion stops when the rearward face of part 92 reaches seal 82.

The opposite operation occurs when vacuum is applied through front port 95. Axial extension occurs first, then pivotal action returning the extension shaft head 65 into a lateral orientation.

Figure 2:
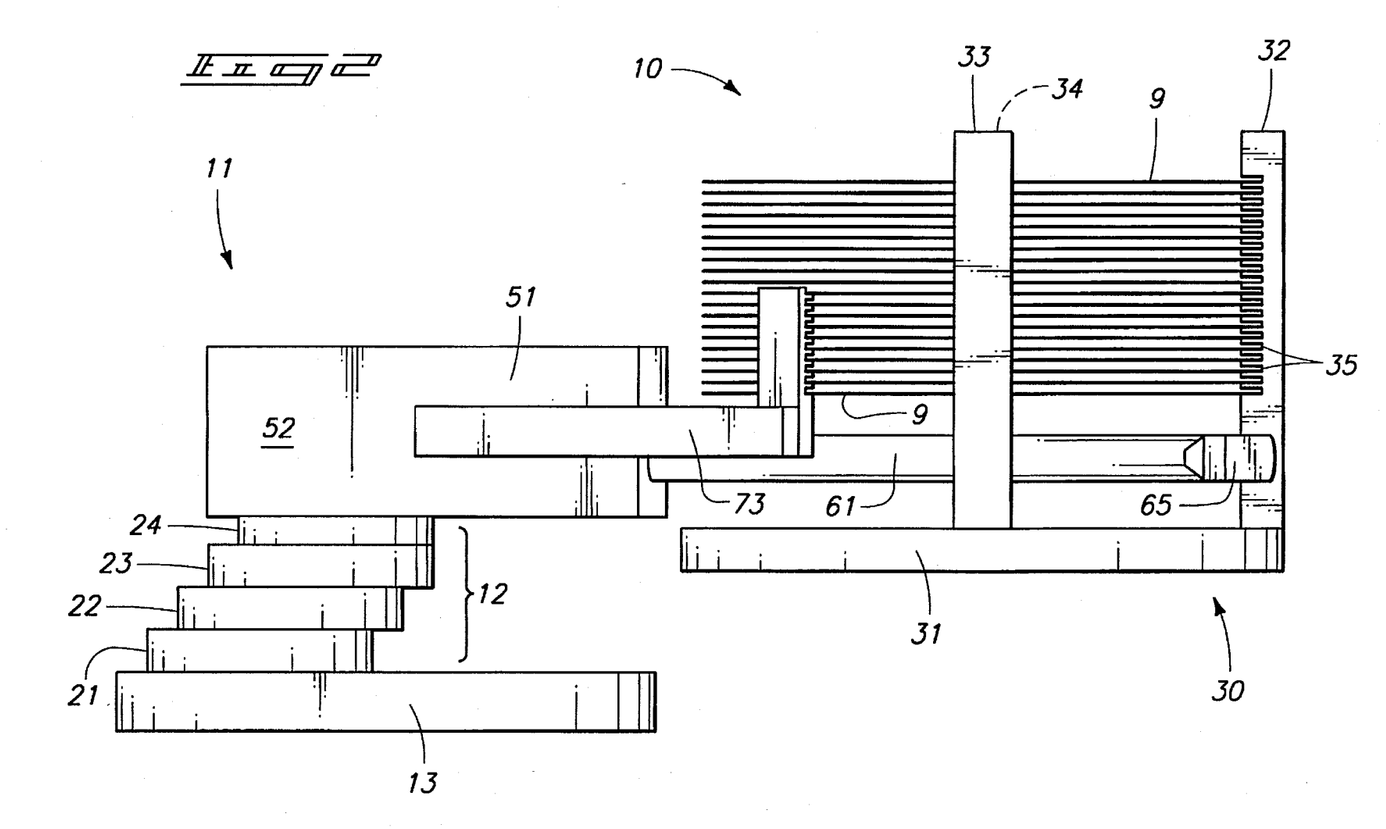
FIG. 2 is an elevational view showing the wafer transfer apparatus of FIG. 1 in another position.
Figure 3:
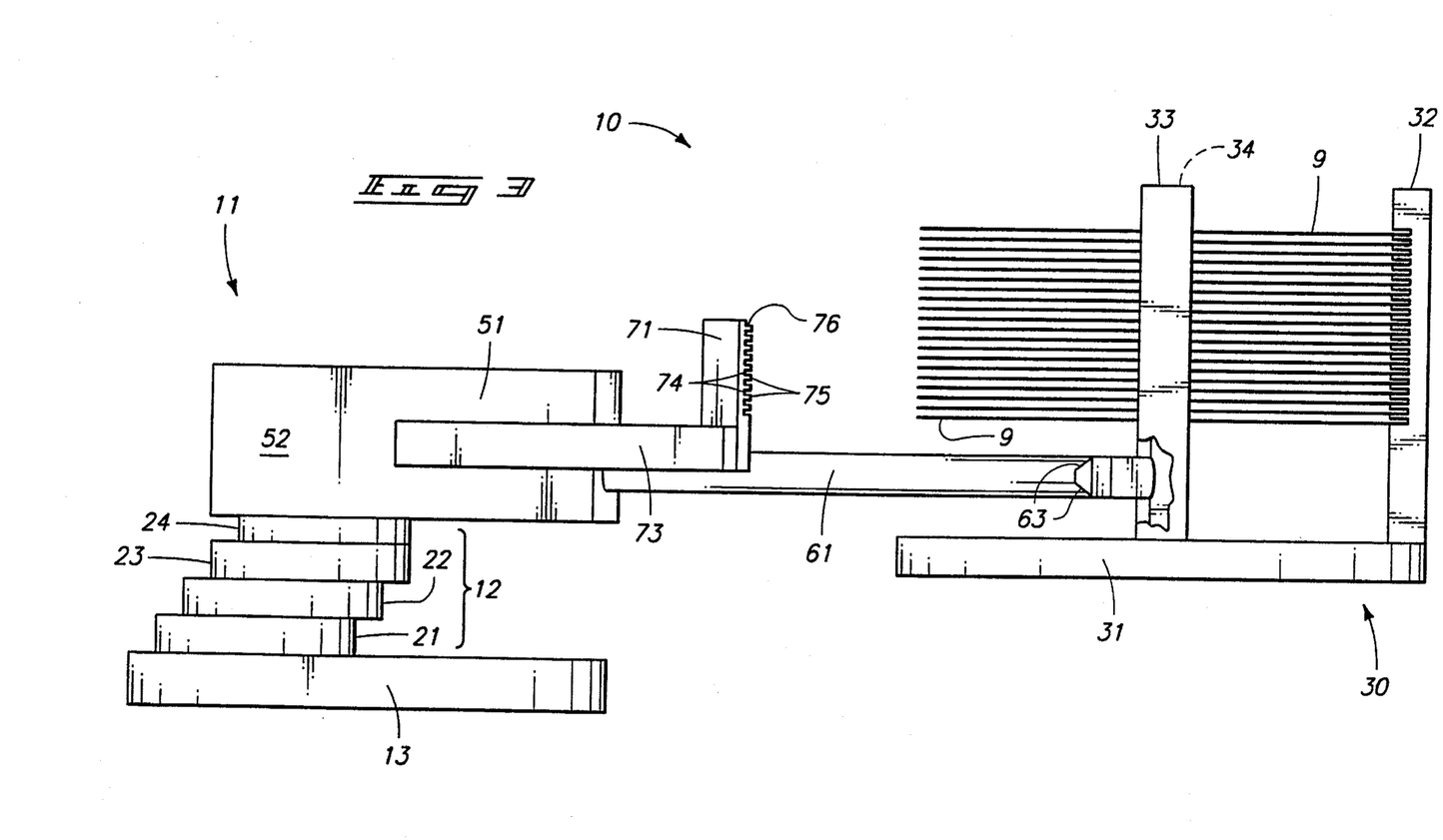
FIG. 3 is an elevational view showing the wafer transfer apparatus of FIG. 1 in a retracted position.

FIGS. 1–3 in particular illustrate the novel methods performed by preferred wafer transfer apparatuses made according to this invention. FIG. 1 shows a group of wafers 9 supported by the movable engagement head 65 and corresponding contact heads 71 and 72. The loading transfer processes preferably include placing one or a group of wafers on the wafer transfer head assembly 11 in a columnar, discretely spaced wafer transfer array. The methods further include laterally moving the one or group of wafers on the wafer transfer apparatus into a wafer station, such as furnace wafer station 30. The wafers are appropriately moved by locating the individual wafers adjacent to wafer support features forming a part of the wafer station. As shown the wafers are moved and positioned in such a manner to effect location of a thin marginal edge band along the periphery of the wafers within the receiving grooves 35 formed in the upright wafer support rails 32–34.

After the wafers are properly positioned within the wafer station, the methods further preferably include lowering one or the group of wafers onto the wafer support features of the wafer station supports. With the wafers transferred onto the station supports, then the wafer transfer apparatus is controlled to effect moving of the distal wafer engagement head 65. This moving action is advantageously performed by axially extending shaft 61 and then pivoting or otherwise reorienting the head from an upright position to a laterally oriented position, such as shown in FIG. 2.

The methods of unloading also preferably include laterally removing the wafer engagement head from the wafer station. As shown, this is accomplished by suitably controlling the wafer transfer arm to move outwardly away from the wafer station. This is indicated by the partially retracted position shown in FIG. 3.

The invention further includes novel methods for transferring one or a group of wafers from a wafer station to the wafer transfer apparatus. The loading transfer process is essentially a reverse of the loading transfer process described above. More specifically, unloading is preferably accomplished by moving a distal wafer engagement head, such as head 65, into a lateral retracted position. This position is shown in FIG. 3. With the extension shaft positioned at a desired elevation, the method further includes laterally moving the wafer transfer apparatus into the wafer station. Typically, the extension shaft will be inserted immediately below the group of wafers which are to be simultaneously removed.

The novel methods further preferably include moving the distal wafer engagement head from the lateral retracted position of FIG. 3 into an upright engaging position, such as shown in FIG. 2. This is done by pivoting or reorienting the angular position of shaft 61 and then by axially retracting the shaft. Thereafter the methods advantageously include raising the wafer transfer apparatus. This results in lifting the one or group of wafers onto the wafer support features on the wafer transfer support heads 65, 71 and 72. The methods also further comprise laterally removing the wafers from the wafer station.

The apparatuses contemplated by this invention can be made from a variety of materials depending upon the service to which the apparatus will be subjected. Preferred materials include stainless steel for essentially many parts of the apparatus included in the wafer transfer head assembly except the secondary assembly extension shaft and head which are preferably formed of quartz. Alternative materials may also be possible.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A wafer transfer apparatus for transferring at least one wafer or other panel to or from a wafer station which holds a wafer station array, comprising:

a primary subassembly;

at least one proximal wafer contact head connected to the primary subassembly; said at least one proximal wafer contact head having at least one wafer support feature for supporting at least one wafer; said at least one proximal wafer contact head being constructed to contact a wafer along proximal marginal edges thereof;

a secondary subassembly mounted upon said primary subassembly; said secondary subassembly having movable portions which can be moved relative to said primary subassembly;

at least one distal wafer engagement head mounted upon said movable portions of the secondary subassembly; said at least one distal wafer engagement head having at least one wafer support feature for supporting a wafer in coordinated position with the at least one proximal wafer contact head; said at least one distal wafer engagement head being constructed to allow a wafer to be contacted along distal marginal edges thereof;

an actuator connected to move the movable portions of the secondary subassembly relative to said primary subassembly; said actuator moving the at least one distal wafer engagement head between an upstanding engaging position and a laterally oriented retracted position.

2. A wafer transfer apparatus according to claim 1 wherein the secondary subassembly cantilevers from the primary subassembly.

3. A wafer transfer apparatus according to claim 1 wherein said movable portions of the secondary subassembly include a rod member which extends in a cantilevered arrangement from the primary subassembly.

4. A wafer transfer apparatus according to claim 1 wherein said movable portions of the secondary subassembly include a member which is mounted for pivotal movement relative to the primary subassembly and which extends in a cantilevered arrangement from the primary subassembly.

5. A wafer transfer apparatus according to claim 1 wherein there is a single distal wafer engagement head.

6. A wafer transfer apparatus according to claim 1 wherein there are at least two proximal wafer contact heads on said primary subassembly.

7. A wafer transfer apparatus according to claim 1 wherein:

there is a single distal wafer engagement head;

there are at least two proximal wafer contact heads on said primary subassembly.

8. A wafer transfer apparatus according to claim 1 wherein said at least one distal wafer engagement head has inwardly convergent side edges.

9. A wafer transfer apparatus according to claim 1 wherein said actuator can both pivot and move axially.

10. A wafer transfer apparatus for simultaneously transferring multiple wafers or other panels to or from a wafer station which holds a wafer station array, comprising:

a primary subassembly;

at least one proximal wafer contact head connected to the primary subassembly; said at least one proximal wafer contact head having wafer support features for supporting a plurality of wafers; said at least one proximal wafer contact head being constructed to contact wafers along proximal marginal edges of the wafers;

a secondary subassembly mounted upon said primary subassembly; said secondary subassembly having movable portions which can be moved relative to said primary subassembly;

at least one distal wafer engagement head mounted upon said movable portions of the secondary subassembly; said at least one distal wafer engagement head having wafer support features for supporting a plurality of wafers in coordinated position with the at least one proximal wafer contact head; said at least one distal wafer engagement head being constructed to allow wafers to be contacted along distal marginal edges of the wafers;

an actuator connected to move the movable portions of the secondary subassembly relative to said primary subassembly; said actuator moving the at least one distal wafer engagement head between an upstanding engaging position and a laterally oriented retracted position.

11. A wafer transfer apparatus according to claim 10 wherein the secondary subassembly cantilevers from the primary subassembly.

12. A wafer transfer apparatus according to claim 10 wherein said movable portions of the secondary subassembly include a rod member which extends in a cantilevered arrangement from the primary subassembly.

13. A wafer transfer apparatus according to claim 10 wherein said movable portions of the secondary subassembly include a member which is mounted for pivotal movement relative to the primary subassembly and which extends in a cantilevered arrangement from the primary subassembly.

14. A wafer transfer apparatus according to claim 10 wherein there is a single distal wafer engagement head.

15. A wafer transfer apparatus according to claim 10 wherein there are at least two proximal wafer contact heads on said primary subassembly.

16. A wafer transfer apparatus according to claim 10 wherein:

there is a single distal wafer engagement head;

there are at least two proximal wafer contact heads on said primary subassembly.

17. A wafer transfer apparatus according to claim 10 wherein said at least one distal wafer engagement head has inwardly convergent side edges.

18. A wafer transfer apparatus according to claim 10 wherein said actuator can both pivot and move axially.

19. A wafer transfer apparatus for simultaneously transferring multiple wafers or other panels to or from a wafer station which holds a columnar, discretely spaced wafer station array, comprising:

a base;

a movable transfer arm assembly mounted to the base;

a primary subassembly mounted upon the movable transfer arm for movement therewith;

at least one proximal wafer contact head connected to the primary subassembly; said at least one proximal wafer contact head having wafer support features for supporting a plurality of wafers; said at least one proximal wafer contact head being constructed to contact wafers along proximal marginal edges of the wafers;

a secondary subassembly mounted upon said primary subassembly; said secondary subassembly having movable portions which can be moved relative to said primary subassembly;

at least one distal wafer engagement head mounted upon said movable portions of the secondary subassembly; said at least one distal wafer engagement head having wafer support features for supporting a plurality of wafers in coordinated position with the at least one proximal wafer contact head; said at least one distal wafer engagement head being constructed to allow wafers to be contacted along distal marginal edges of the wafers;

an actuator connected to move the movable portions of the secondary subassembly relative to said primary subassembly; said actuator moving the at least one distal wafer engagement head between an upstanding engaging position and a laterally oriented retracted position.

20. A wafer transfer apparatus according to claim 19 wherein the secondary subassembly cantilevers from the primary subassembly.

21. A wafer transfer apparatus according to claim 19 wherein said movable portions of the secondary subassembly include a rod member which extends in a cantilevered arrangement from the primary subassembly.

22. A wafer transfer apparatus according to claim 19 wherein said movable portions of the secondary subassembly include a member which is mounted for pivotal movement relative to the primary subassembly and which extends in a cantilevered arrangement from the primary subassembly.

23. A wafer transfer apparatus according to claim 19 wherein there is a single distal wafer engagement head.

24. A wafer transfer apparatus according to claim 19 wherein there are at least two proximal wafer contact heads on said primary subassembly.

25. A wafer transfer apparatus according to claim 19 wherein:

there is a single distal wafer engagement head;

there are at least two proximal wafer contact heads on said primary subassembly.

26. A wafer transfer apparatus according to claim 19 wherein said at least one distal wafer engagement head has inwardly convergent side edges.

27. A wafer transfer apparatus according to claim 19 wherein said actuator can both pivot and move axially.

28. A wafer transfer apparatus for simultaneously transferring multiple wafers or other panels to or from a wafer station which holds a columnar, discretely spaced wafer station array, comprising:

a base;

a movable transfer arm assembly mounted to the base;

a primary subassembly mounted upon the movable transfer arm for movement therewith;

at least one proximal wafer contact head connected to the primary subassembly; said at least one proximal wafer contact head having wafer support features for supporting a plurality of wafers; said at least one proximal wafer contact head being constructed to contact wafers along proximal marginal edges of the wafers;

a secondary subassembly mounted upon said primary subassembly; said secondary subassembly having movable portions which are pivotal relative to said primary subassembly;

at least one distal wafer engagement head mounted upon said movable portions of the secondary subassembly;

said at least one distal wafer engagement head having wafer support features for supporting a plurality of wafers in coordinated position with the at least one proximal wafer contact head; said at least one distal wafer engagement head being constructed to allow wafers to be contacted along distal marginal edges of the wafers;

an actuator connected to pivot the movable portions of the secondary subassembly relative to said primary subassembly; said actuator pivoting the at least one distal wafer engagement head between an upstanding engaging position and a laterally oriented retracted position.

29. A wafer transfer apparatus according to claim 28 wherein the secondary subassembly cantilevers from the primary subassembly.

30. A wafer transfer apparatus according to claim 28 wherein said movable portions of the secondary subassembly include a rod member which extends in a cantilevered arrangement from the primary subassembly.

31. A wafer transfer apparatus according to claim 28 wherein there is a single distal wafer engagement head.

32. A wafer transfer apparatus according to claim 28 wherein there are at least two proximal wafer contact heads on said primary subassembly.

33. A wafer transfer apparatus according to claim 28 wherein:

there is a single distal wafer engagement head;

there are at least two proximal wafer contact heads on said primary subassembly.

34. A wafer transfer apparatus according to claim 28 wherein said at least one distal wafer engagement head has inwardly convergent side edges.

35. A wafer transfer apparatus according to claim 28 wherein said actuator can pivot and move axially.

36. A wafer transfer apparatus for transferring at least one wafer or other panel to or from a wafer station which holds a wafer station array, comprising:

a primary subassembly;

at least one proximal wafer contact head connected to the primary subassembly; said at least one proximal wafer contact head having at least one wafer support feature for supporting at least one wafer;

a secondary subassembly mounted upon said primary subassembly; said secondary subassembly having movable portions which can be moved relative to said primary subassembly;

at least one distal wafer engagement head mounted upon said movable portions of the secondary subassembly; said at least one distal wafer engagement head having at least one wafer support feature for supporting a wafer;

an actuator connected to move the movable portions of the secondary subassembly relative to said primary subassembly; said actuator moving the at least one distal wafer engagement head between an upstanding engaging position and a laterally oriented retracted position.

37. A wafer transfer apparatus according to claim 36 wherein the secondary subassembly cantilevers from the primary subassembly.

38. A wafer transfer apparatus according to claim 36 wherein said movable portions of the secondary subassembly include a rod member which extends in a cantilevered arrangement from the primary subassembly.

39. A wafer transfer apparatus according to claim 36 wherein said movable portions of the secondary subassembly include a member which is mounted for pivotal movement relative to the primary subassembly and which extends in a cantilevered-arrangement from the primary subassembly.

40. A wafer transfer apparatus according to claim 36 wherein there is a single distal wafer engagement head.

41. A wafer transfer apparatus according to claim 36 wherein there are at least two proximal wafer contact heads on said primary subassembly.

42. A wafer transfer apparatus according to claim 36 wherein:

there is a single distal wafer engagement head;

there are at least two proximal wafer contact heads on said primary subassembly.

43. A wafer transfer apparatus according to claim 36 wherein said at least one distal wafer engagement head has inwardly convergent side edges.

44. A wafer transfer apparatus according to claim 36 wherein said actuator can both pivot and move axially.

45. A wafer transfer apparatus for simultaneously transferring multiple wafers or other panels to or from a wafer station which holds a wafer station array, comprising:

a primary subassembly;

at least one proximal wafer contact head connected to the primary subassembly; said at least one proximal wafer contact head having wafer support features for supporting a plurality of wafers;

a secondary subassembly mounted upon said primary subassembly; said secondary subassembly having movable portions which can be moved relative to said primary subassembly;

at least one distal wafer engagement head mounted upon said movable portions of the secondary subassembly; said at least one distal wafer engagement head having wafer support features for supporting a plurality of wafers in coordinated position with the at least one proximal wafer contact head;

an actuator connected to move the movable portions of the secondary subassembly relative to said primary subassembly; said actuator moving the at least one distal wafer engagement head between an upstanding engaging position and a laterally oriented retracted position.

46. A wafer transfer apparatus according to claim 45 wherein the secondary subassembly cantilevers from the primary subassembly.

47. A wafer transfer apparatus according to claim 45 wherein said movable portions of the secondary subassembly include a rod member which extends in a cantilevered arrangement from the primary subassembly.

48. A wafer transfer apparatus according to claim 45 wherein said movable portions of the secondary subassembly include a member which is mounted for pivotal movement relative to the primary subassembly and which extends in a cantilevered arrangement from the primary subassembly.

49. A wafer transfer apparatus according to claim 45 wherein there is a single distal wafer engagement head.

50. A wafer transfer apparatus according to claim 45 wherein there are at least two proximal wafer contact heads on said primary subassembly.

51. A wafer transfer apparatus according to claim 45 wherein: there is a single distal wafer engagement head; there are at least two proximal wafer contact heads on said primary subassembly.

52. A wafer transfer apparatus according to claim 45 wherein said at least one distal wafer engagement head has inwardly convergent side edges.

53. A wafer transfer apparatus according to claim 45 wherein said actuator can both pivot and move axially.

54. A wafer transfer apparatus for transferring at least one wafer or other panel to or from a wafer station which holds a wafer station array, comprising:

a primary subassembly;

a secondary subassembly mounted upon said primary subassembly; said secondary subassembly having movable portions which can be moved relative to said primary subassembly;

at least one distal wafer engagement head mounted upon said movable portions of the secondary subassembly; said at least one distal wafer engagement head having at least one wafer support feature for supporting a wafer;

an actuator connected to move the movable portions of the secondary subassembly relative to said primary subassembly; said actuator moving the at least one distal wafer engagement head between an upstanding engaging position and a laterally oriented retracted position; said actuator moving the movable portions of the secondary subassembly both pivotally and axially.

55. A wafer transfer apparatus according to claim 54 wherein the secondary subassembly cantilevers from the primary subassembly.

56. A wafer transfer apparatus according to claim 54 wherein said movable portions of the secondary subassembly include a rod member which extends in a cantilevered arrangement from the primary subassembly.

57. A wafer transfer apparatus according to claim 54 wherein there is a single distal wafer engagement head.

58. A wafer transfer apparatus according to claim 54 wherein there are at least two proximal wafer contact heads on said primary subassembly.

59. A wafer transfer apparatus according to claim 54 wherein said at least one distal wafer engagement head has inwardly convergent side edges.

60. A wafer transfer apparatus for simultaneously transferring multiple wafers or other panels to or from a wafer station which holds a wafer station array, comprising:

a primary subassembly;

a secondary subassembly mounted upon said primary subassembly; said secondary subassembly having movable portions which can be moved relative to said primary subassembly;

at least one distal wafer engagement head mounted upon said movable portions of the secondary subassembly; said at least one distal wafer engagement head having wafer support features for supporting a plurality of wafers;

an actuator connected to move the movable portions of the secondary subassembly relative to said primary subassembly; said actuator moving the at least one distal wafer engagement head between an upstanding engaging position and a laterally oriented retracted position; said actuator moving the movable portions of the secondary subassembly both pivotally and axially.

61. A wafer transfer apparatus according to claim 60 wherein the secondary subassembly cantilevers from the primary subassembly.

62. A wafer transfer apparatus according to claim 60 wherein said movable portions of the secondary subassembly include a rod member which extends in a cantilevered arrangement from the primary subassembly.

63. A wafer transfer apparatus according to claim 60 wherein there is a single distal wafer engagement head.

64. A wafer transfer apparatus according to claim 60 wherein there are at least two proximal wafer contact heads on said primary subassembly.

65. A wafer transfer apparatus according to claim 60 wherein said at least one distal wafer engagement head has inwardly convergent side edges.

* * * * *